(12) United States Patent
Bao et al.

(10) Patent No.: US 11,855,131 B2
(45) Date of Patent: Dec. 26, 2023

(54) SEMICONDUCTOR STRUCTURE AND PREPARATION METHOD THEREOF

(71) Applicant: CHANGXIN MEMORY TECHNOLOGIES, INC., Hefei (CN)

(72) Inventors: Xifei Bao, Hefei (CN); Yaoyao Chu, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 207 days.

(21) Appl. No.: 17/446,454

(22) Filed: Aug. 30, 2021

(65) Prior Publication Data

US 2021/0391415 A1    Dec. 16, 2021

Related U.S. Application Data

(63) Continuation of application No. PCT/CN2021/076099, filed on Feb. 8, 2021.

(30) Foreign Application Priority Data

Feb. 24, 2020 (CN) .......................... 202010110965.1

(51) Int. Cl.
*H10B 12/00* (2023.01)
*H01L 49/02* (2006.01)

(52) U.S. Cl.
CPC .............. *H01L 28/91* (2013.01); *H01L 28/87* (2013.01); *H10B 12/03* (2023.02)

(58) Field of Classification Search
CPC .............. H01L 28/82; H01L 28/90–92; H01L 29/66181; H01L 29/945; H01L 21/76816; H01L 28/87; H01L 28/91; H10B 12/03; H10B 12/033; H10B 12/30
See application file for complete search history.

(56) References Cited

U.S. PATENT DOCUMENTS

| | | |
|---|---|---|
| 6,458,653 B1 | 10/2002 | Jang |
| 2006/0124582 A1 | 6/2006 | Kundalgurki |
| 2007/0111434 A1 | 5/2007 | Ikeda |
| 2007/0269946 A1 | 11/2007 | Wang et al. |

(Continued)

FOREIGN PATENT DOCUMENTS

| | | |
|---|---|---|
| CN | 1967809 A | 5/2007 |
| CN | 101047185 A | 10/2007 |

(Continued)

OTHER PUBLICATIONS

Written Opinion of the International Search Authority in the international application No. PCT/CN2021/076099, dated Apr. 16, 2021.

(Continued)

*Primary Examiner* — Jose R Diaz
(74) *Attorney, Agent, or Firm* — SYNCODA LLC; Feng Ma

(57) ABSTRACT

A preparation method of a semiconductor structure includes: providing a substrate, and forming a groove on the substrate by etching; forming a first dielectric layer on a side wall of the groove; forming a first electrode on the bottom of the groove and on an inner surface of the first dielectric layer; forming a second dielectric layer on a surface of the first electrode; and forming a second electrode on a surface of the second dielectric layer.

14 Claims, 8 Drawing Sheets

(56) References Cited

U.S. PATENT DOCUMENTS

2013/0122712 A1   5/2013  Kim
2014/0015097 A1*  1/2014  Greeley .................. H01L 28/75
                                                                                257/532

FOREIGN PATENT DOCUMENTS

| CN | 101315905 A | 12/2008 | |
|----|-------------|---------|---|
| CN | 101461037 A | 6/2009  | |
| CN | 101609795 A | 12/2009 | |
| CN | 101783317 A | 7/2010  | |
| CN | 107331655 A | 11/2017 | |
| CN | 107895721 A | 4/2018  | |
| WO | WO-2019007373 A1 * | 1/2019 | ........... H01L 21/308 |

OTHER PUBLICATIONS

International Search Report (ISR) in PCT/CN2021/076099 dated Apr. 15, 2021.
CN 1st Office Action in Application No. 202010110965.1, dated Feb. 16, 2022.

* cited by examiner

SEMICONDUCTOR STRUCTURE AND PREPARATION METHOD THEREOF

CROSS-REFERENCE TO RELATED APPLICATIONS

This is a continuation of International Application No. PCT/CN2021/076099 filed on Feb. 8, 2021, which claims priority to Chinese Patent Application No. 202010110965.1 filed on Feb. 24, 2020. The disclosures of these applications are hereby incorporated by reference in their entirety.

BACKGROUND

A dynamic random-access memory (DRAM) unit includes a capacitor for storing electric charge and a transistor for accessing the capacitor. The DRAM stores data by the electric charge on the capacitor, so it is necessary to recharge the capacitor regularly every few milliseconds. The larger the capacitance of the capacitor is, the longer the retention time of the data stored in the DRAM is. Therefore, a depth-to-width ratio of the capacitor of the DRAM in the prior art is relatively high.

SUMMARY

Embodiments of the present disclosure relate generally to the technical field of semiconductors, and more specifically to a semiconductor structure and a preparation method thereof.

An objective of some embodiments of the present disclosure is to provide a semiconductor structure and a preparation method thereof, which can effectively avoid a defect caused by connection between first electrodes in adjacent grooves.

Some embodiments of the present disclosure provide a preparation method of a semiconductor structure, the preparation method including: providing a substrate; forming a groove on the substrate; forming a first dielectric layer on a side wall of the groove; forming a first electrode on the bottom of the groove and on an inner surface of the first dielectric layer; forming a second dielectric layer on a surface of the first electrode; and forming a second electrode on a surface of the second dielectric layer.

In one of the embodiments, the side wall of the groove has a recess region, and the first dielectric layer covers the recess region. In this way, it is beneficial to avoid a short circuit caused by contact between adjacent electrodes due to the existence of the recess regions.

In one of the embodiments, the first dielectric layer formed in the recess region on the side wall of the groove is in direct contact with the first dielectric layer on a side wall of a groove adjacent to the groove.

In one of the embodiments, a material of the first dielectric layer contains a high-K material. In this way, it is beneficial to improve an electrode isolation effect between the adjacent grooves.

In one of the embodiments, the high-K material contains any one or any combination of Zr, Hf, Nb, Al and O.

In one of the embodiments, the substrate includes a sacrificial layer and a support layer located above the sacrificial layer; after forming the second dielectric layer on the surface of the first electrode and before forming the second electrode on the surface of the second dielectric layer, the method further includes: forming an opening for at least exposing part of the sacrificial layer by etching the support layer; forming a space region for exposing an outer surface of the first dielectric layer by etching and removing the sacrificial layer through the opening; and forming the second electrode in the space region.

In one of the embodiments, forming the opening for at least exposing the part of the sacrificial layer by etching the support layer further includes: exposing the first electrode through the opening; and after forming the space region for exposing the outer surface of the first dielectric layer by etching and removing the sacrificial layer through the opening and before forming the second electrode on the surface of the second dielectric layer, the method further includes: depositing a third dielectric layer on the exposed first electrode. In this way, it is beneficial to avoid a short circuit caused by contact between the first electrode and the second electrode, thereby improving the yield of the semiconductor structure.

Some embodiments of the present disclosure further provide a semiconductor structure, including: a substrate having a groove; a first dielectric layer located on a side wall of the groove; a first electrode located on the bottom of the groove and on an inner surface of the first dielectric layer; a second dielectric layer located on a surface of the first electrode; and a second electrode located on a surface of the second dielectric layer.

In one of the embodiments, the substrate includes a support layer, wherein the groove runs through the support layer so that a side surface of the support layer is formed, and the first dielectric layer is in direct contact with the side surface of the support layer.

In one of the embodiments, the second electrode is also located on an outer surface of the first dielectric layer.

In one of the embodiments, a material of the first dielectric layer contains a high-K material.

In one of the embodiments, the high-K material contains any one or any combination of Zr, Hf, Nb, Al and O.

In one of the embodiments, the semiconductor structure further includes a third dielectric layer which is located between the top of the first electrode and the second electrode and which is in direct contact with the first electrode and the second electrode.

In one of the embodiments, a material of the third dielectric layer contains a high-K material.

In one of the embodiments, the side wall of the groove has a recess region, and the first dielectric layer covers the recess region.

In one of the embodiments, the first dielectric layer in the recess region on the side wall of the groove is in direct contact with the first dielectric layer on a side wall of a groove adjacent to the groove.

In some embodiments of the present disclosure, the first dielectric layer is deposited before preparation of the first electrode in the groove; and then, the first electrode and the second dielectric layer are sequentially formed in the groove, and the second electrode is formed in the groove and on an upper surface of the substrate. By depositing the first dielectric layer in advance, an isolation effect between adjacent first electrodes may be realized, such that the contact between the first electrodes in the two adjacent grooves due to the existence of the recess regions is avoided when the first electrode is deposited, thereby ensuring the effectiveness of the semiconductor structure.

BRIEF DESCRIPTION OF THE DRAWINGS

One or more embodiments are illustrated by corresponding accompanying drawings which do not limit the embodiments. Components with the same reference numbers in the accompanying drawings represent similar components, and there is no scale limitation in the accompanying drawings otherwise particularly represented.

FIG. 1 is a first schematic structure diagram corresponding to a step of a preparation method of a semiconductor structure according to an embodiment of the present disclosure.

DETAILED DESCRIPTION

Some embodiments of the present disclosure provide a preparation method of a semiconductor structure, the preparation method including: providing a substrate; forming a groove on the substrate; forming a first dielectric layer on a side wall of the groove; forming a first electrode on the bottom of the groove and on an inner surface of the first dielectric layer; forming a second dielectric layer on a surface of the first electrode; and forming a second electrode on a surface of the second dielectric layer. By depositing the first dielectric layer before depositing the first electrode, the adjacent first electrodes are isolated, such that the contact between the first electrodes in two adjacent grooves due to the existence of recess regions is avoided when the first electrode is deposited, thereby ensuring the effectiveness of the semiconductor structure.

For clearer descriptions of the objective, technical solutions, and advantages of the embodiments of the present disclosure, the embodiments of the present disclosure are described in detail hereinafter with reference to the accompanying drawings. However, a person of ordinary skill in the art can understand that in each embodiment of the present disclosure, many technical details are proposed in order to make readers better understand the present disclosure. Even without these technical details and various changes and modifications based on the following embodiments, the technical solutions claimed in the present disclosure can be realized.

The inventors of the present disclosure have recognized that it becomes increasingly difficult to control the shape of a capacitor hole along with the increase of a depth-to-width ratio of the capacitor hole for the capacitor of the DRAM, and adjacent capacitance holes are prone to a defect when a first electrode is deposited, resulting in a reduced yield.

FIGS. 1 to 8 are schematic cross-sectional structure diagrams respectively corresponding to each step of a preparation method of a semiconductor structure according to an embodiment of the present disclosure.

Figure 1:
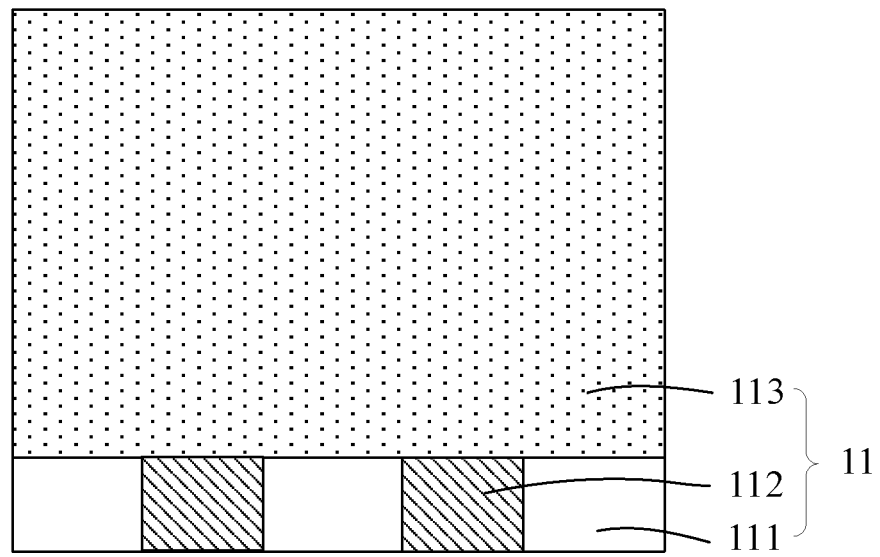

Referring to FIG. 1, a substrate 11 is provided, and includes a substrate 111 and an intermediate dielectric layer 113 located on the substrate 111, wherein a conductive structure 112 is arranged in the substrate 111. The intermediate dielectric layer 113 is used to define a pattern, wherein the intermediate dielectric layer 113 may be formed by a deposition process such as an atomic layer deposition process or a chemical vapor deposition process.

In the present embodiment, the conductive structure 112 is used to connect with each capacitor formed subsequently to store data. It should be noted that a word line, a bit line, a transistor, an isolation groove and other structures may also be formed inside the substrate 111.

Figure 2:
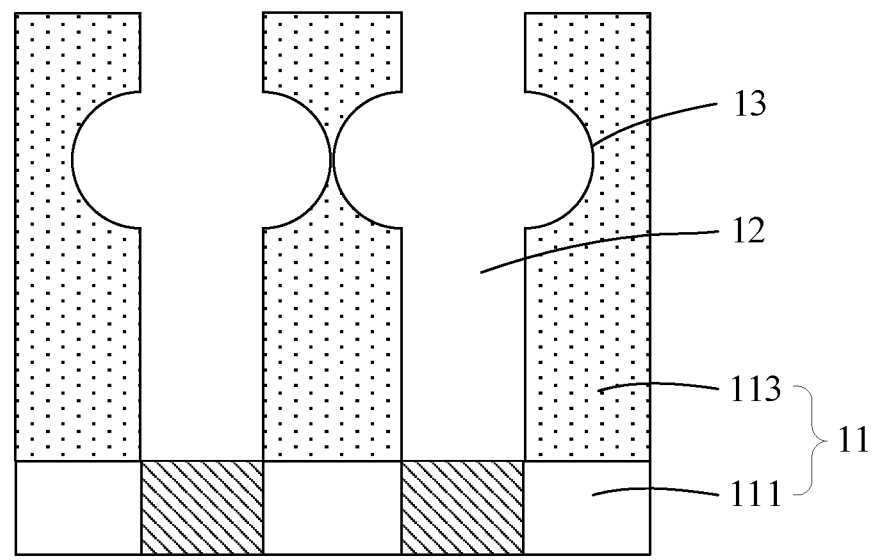
FIG. 2 is a second schematic structure diagram corresponding to a step of a preparation method of a semiconductor structure according to an embodiment of the present disclosure.

Referring to FIG. 2, a groove 12 is formed in the substrate 11.

In the present embodiment, the groove 12 is a cylindrical hole. In other embodiments, the shape of the groove may be others, and is not limited in the embodiments of the present disclosure. In one of the embodiments, the groove 12 may be formed by etching the intermediate dielectric layer 113 using a multiple patterned photoetching and etching process to improve the accuracy of the photoetching and etching.

In the present embodiment, the side wall of the groove 12 has a recess region 13 which is sunken in a direction away from a central axis of the groove 12.

Figure 3:
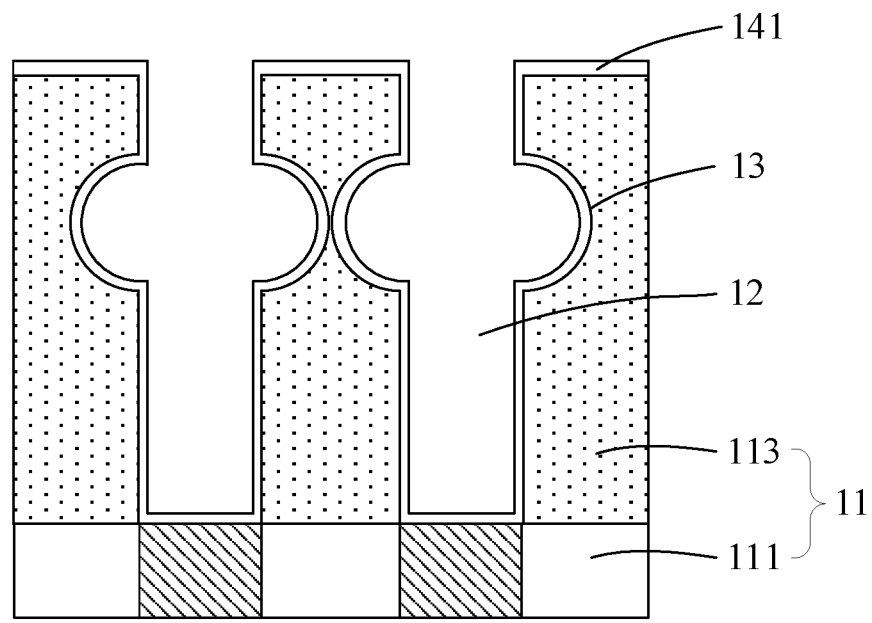
FIG. 3 is a third schematic structure diagram corresponding to a step of a preparation method of a semiconductor structure according to an embodiment of the present disclosure.
Figure 4:
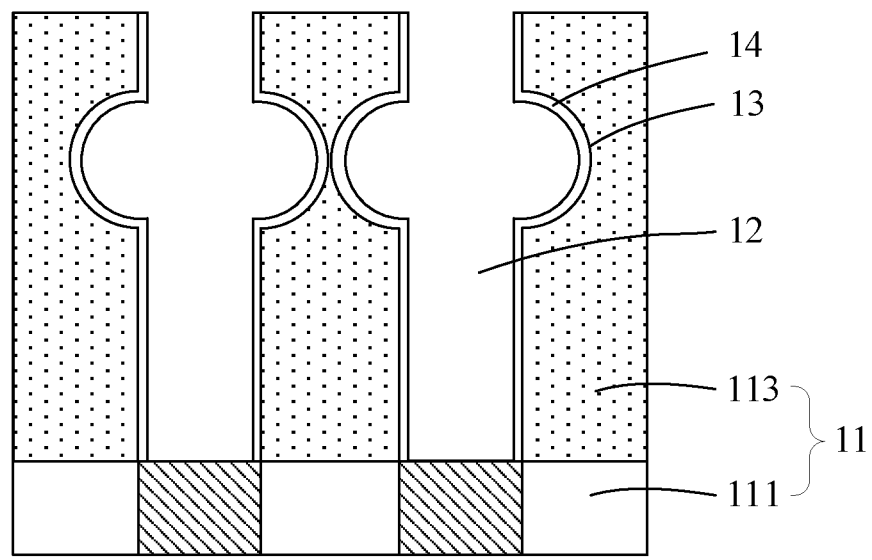
FIG. 4 is a fourth schematic structure diagram corresponding to a step of a preparation method of a semiconductor structure according to an embodiment of the present disclosure.

Referring to FIGS. 3 to 4, a first dielectric layer 14 is formed on a side wall of the groove 12.

In some embodiments, a first dielectric film 141 is formed on the bottom and side wall of the groove 12 and on an upper surface of the intermediate dielectric layer 113 by a process such as chemical vapor deposition or atomic layer deposition; and the first dielectric film 141 on the bottom of the groove 12 and on the top of the intermediate dielectric layer 113 is removed by a dry etching process to form the first dielectric layer 14.

It should be noted that using the high-power dry etching process to etch the first dielectric film 141 to form the first dielectric layer 14 is beneficial to improving the etching accuracy of the first dielectric layer 14.

In the present embodiment, the recess region 13 runs through the intermediate dielectric layer 113. In this way, the first dielectric layer 14 formed in the recess region 13 on a side wall of the groove 12 is in direct contact with the first dielectric layer 14 on a side wall of the adjacent groove 12.

In the present embodiment, the material of the first dielectric layer 14 contains a high-K material, which helps to ensure the isolation effect of the first dielectric layers 14. Thus, the connection of the first electrodes formed subsequently and located in two adjacent grooves 12 is avoided. In some embodiments, the material of the first dielectric layer 14 contains any one or any combination of Zr, Hf, Nb, Al and O. Specifically, the first dielectric layer 14 is any one or any combination of ZrO, AlO, ZrNbO, ZrHfO and ZrAlO.

In one of the embodiments, in the present embodiment, the thickness of the first dielectric layer 14 ranges from 2 nm to 10 nm, for example, 4 nm, 6 nm or 8 nm. It should be noted that in practical applications, the thickness of the first dielectric layer 14 is determined based on the diameter of the groove 12 and the thicknesses of each of the first electrode, the second dielectric layer and the second electrode formed subsequently to ensure that an enough deposition space for the subsequent first electrode, second dielectric layer and second electrode is reserved and the thickness of the first dielectric layer 14 is enough to isolate the first electrodes in two adjacent grooves 12. Preferably, the thickness of the first dielectric layer 14 is greater than the thickness of the second dielectric layer and the thickness of the second electrode, such that the first dielectric layer 14 has a sufficient supporting capacity to prevent collapse.

Figure 5:
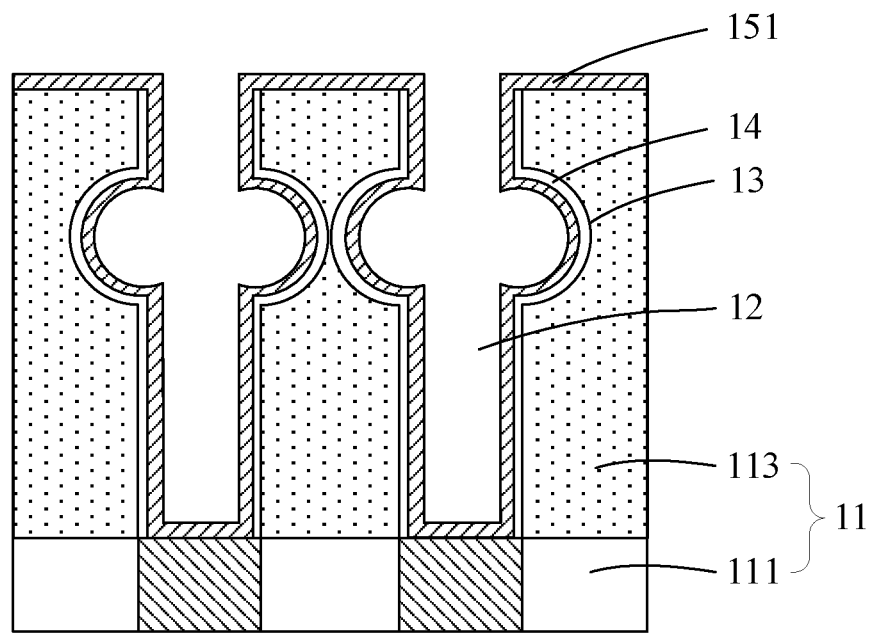
FIG. 5 is a fifth schematic structure diagram corresponding to a step of a preparation method of a semiconductor structure according to an embodiment of the present disclosure.
Figure 6:
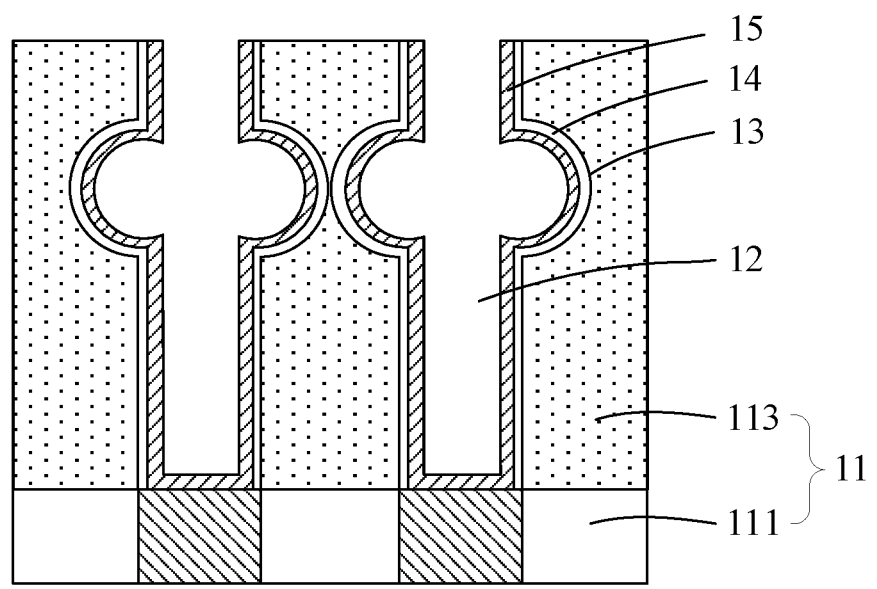
FIG. 6 is a sixth schematic structure diagram corresponding to a step of a preparation method of a semiconductor structure according to an embodiment of the present disclosure.

Referring to FIGS. 5 to 6, a first electrode 15 is formed on the bottom of the groove 12 and on the inner surface of the first dielectric layer 14.

In some embodiments, a first electrode film 151 may be deposited by a deposition process such as the atomic layer deposition process, a physical vapor deposition process or a plasma deposition process, and is located on the bottom and side wall of the groove 12 and on the top of the intermediate dielectric layer 113. The first electrode film 151 on the top of the intermediate dielectric layer 113 is removed by dry etching or wet etching to form the first electrode 15.

In the present embodiment, the material of the first electrode 15 includes any one or any combination of titanium nitride, tantalum nitride, copper, tungsten, and the like. In one of the embodiments, using a low-power dry etching process to etch the first electrode film 151 can improve the etching accuracy of the first electrode 15.

Figure 7:
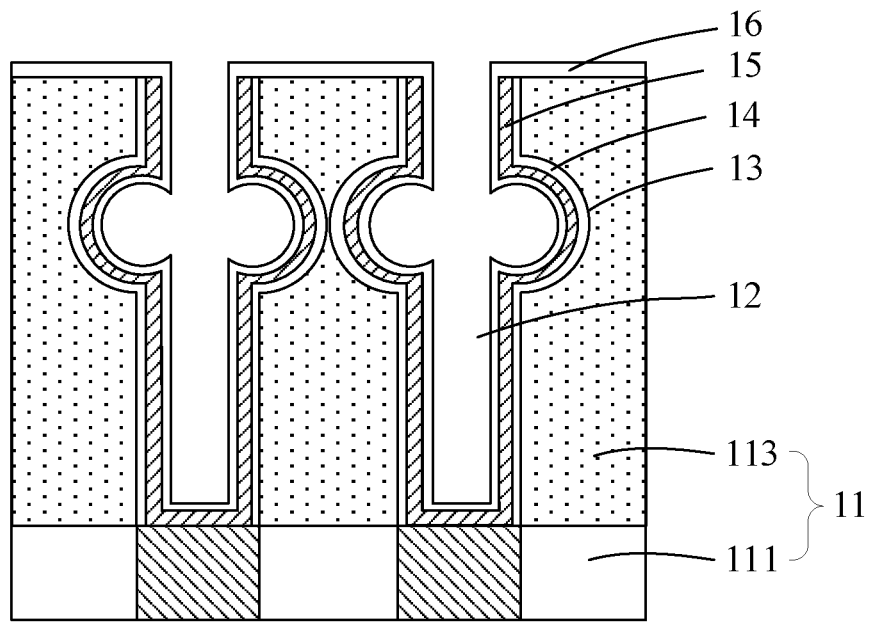
FIG. 7 is a seventh schematic structure diagram corresponding to a step of a preparation method of a semiconductor structure according to an embodiment of the present disclosure.

Referring to FIG. 7, a second dielectric layer 16 is formed on a surface of the first electrode 15.

In the present embodiment, the chemical vapor deposition process, the atomic layer deposition process or the like is used to deposit the second dielectric layer 16 on the surface of the first electrode 15 and on the top surface of the substrate 11. In other embodiments, the second dielectric layer may also cover the surface of the first electrode.

In the present embodiment, a material of the second dielectric layer 16 contains a high-K material, and may be the same as or different from the material of the first dielectric layer 14, which is not limited in the embodiments of the present disclosure.

Figure 8:
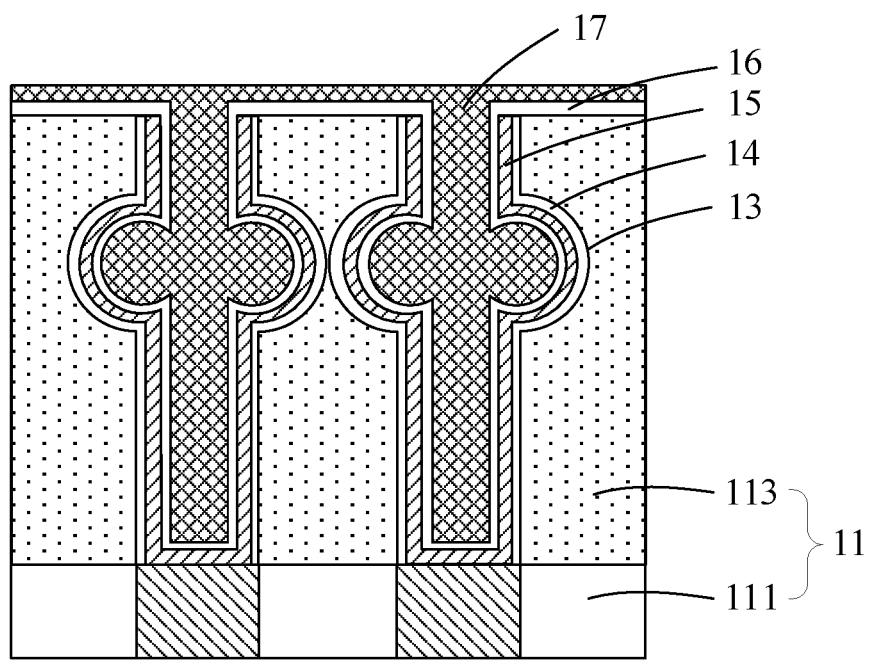
FIG. 8 is an eighth schematic structure diagram corresponding to a step of a preparation method of a semiconductor structure according to an embodiment of the present disclosure.
Figure 9:
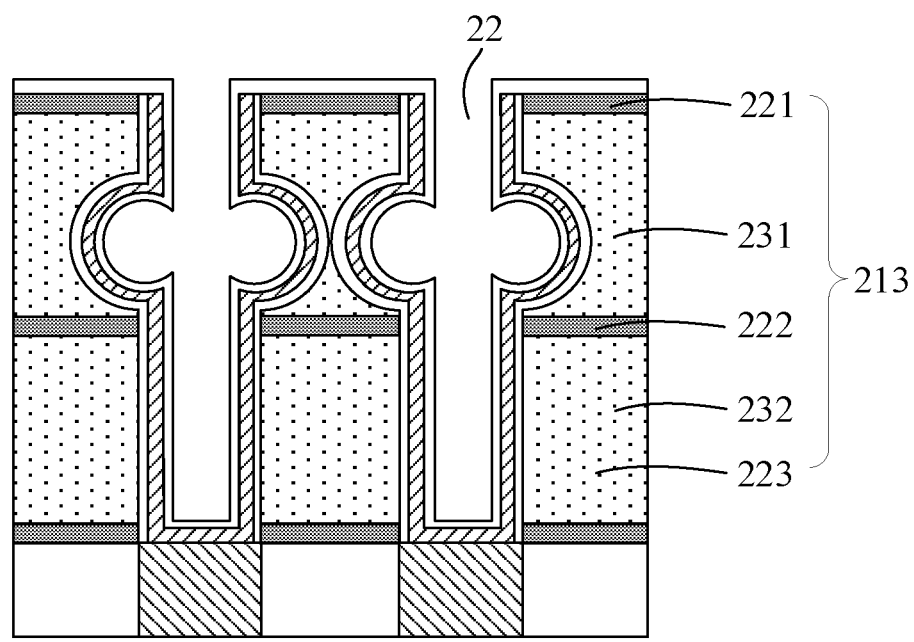
FIG. 9 is a first schematic structure diagram corresponding to a step of a preparation method of a semiconductor structure according to another embodiment of the present disclosure.

Referring to FIG. 8, a second electrode 17 is formed on the surface of the second dielectric layer 16.

In the present embodiment, the second electrode 17 covers the surface of the second dielectric layer 16 and fills the entire groove 12. In other embodiments, the second electrode covers the surface of the second dielectric layer. A material of the second electrode 17 includes a compound formed by one or two of metal nitrides and metal silicides, such as titanium nitride, titanium silicide, nickel silicide and TiSi$_x$N$_y$, or other conductive materials. The material of the second electrode 17 may also be a conductive semiconductor material, such as polysilicon, or germanium silicon.

In the above preparation method of the semiconductor structure, by depositing the first dielectric layer 14 in advance, the first electrodes 15 in adjacent grooves 12 are isolated, such that the connection of the first electrodes 15 in two adjacent grooves 12 due to the existence of the recess regions 13 is avoided when the first electrode 15 is deposited, thereby ensuring the effectiveness of the capacitor.

Another embodiment of the present disclosure also provides a preparation method of a semiconductor structure. The technical solution provided by the present embodiment is substantially the same as that in the previous embodiment. The main improvement of the present embodiment is that the second electrode is located on the other side of the first dielectric layer opposite to the first electrode.

FIGS. 9 to 12 are schematic structure diagrams respectively corresponding to each step of a preparation method of a semiconductor structure according to another embodiment of the present disclosure. The same or corresponding parts as those of the previous embodiment may be understood by referring to the description of the previous embodiment, and are not repeated herein.

In the present embodiment, the intermediate dielectric layer 213 includes a support layer and a sacrificial layer. In some embodiments, the intermediate dielectric layer 213 includes a first support layer 221 at the top, a second support layer 222 at the middle, a third support layer at the bottom, a first sacrificial layer 231 located between the first support layer 221 and the second support layer 222, and a second sacrificial layer 232 located between the second support layer 222 and the third support layer 223. By arranging the support layer on each of the top, middle and bottom of the intermediate dielectric layer 213, it can be ensured that the first dielectric layer 24 formed subsequently does not collapse in case that the groove 22 with a larger depth-width ratio is formed by etching when the intermediate dielectric layer 213 is thick.

In other embodiments, the number and position of each of the support layer and the sacrificial layer are not limited, and the number of each of the support layer and the sacrificial layer may be appropriately increased to increase the height of the capacitor, thereby further increasing the capacitance value of the capacitor. It is also possible to appropriately reduce the number of the support layers. For example, the support layers only include the first support layer and the second support layer.

In the present embodiment, the first support layer 221, the second support layer 222 and the third support layer 223 are made of silicon nitride, and the first sacrificial layer 231 and the second sacrificial layer 232 are made of any one or any combination of silicon oxide, BPSG, PSG, BSG and TEOS.

Figure 10:
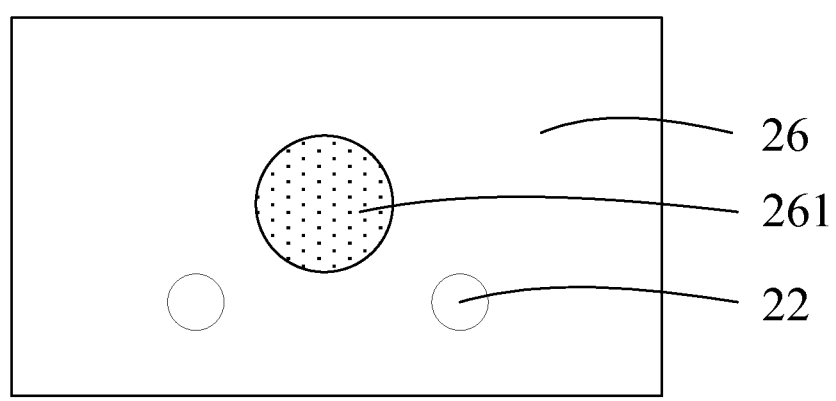
FIG. 10 is a second schematic structure diagram corresponding to a step of a preparation method of a semiconductor structure according to the other embodiment of the present disclosure.
Figure 11:
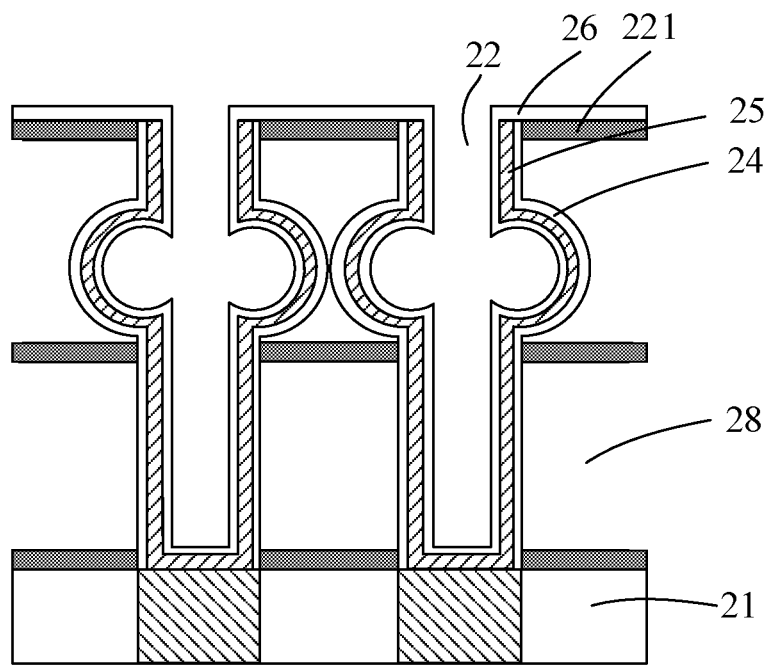
FIG. 11 is a third schematic structure diagram corresponding to a step of a preparation method of a semiconductor structure according to the other embodiment of the present disclosure.

Referring to FIGS. 10 and 11, the support layer is etched to form an opening 261 for exposing at least part of the sacrificial layer; and a space area 28 for exposing the outer surface of the first dielectric layer 24 is formed by etching and removing the sacrificial layer through the opening 261.

In some embodiments, FIG. 10 is a structural top view of the semiconductor structure corresponding to this step. As shown in FIG. 10, in the present embodiment, the opening 261 is located between the grooves 22 and has no common part with the grooves 22, and the top view of the opening 261 is circular. In other embodiments, the opening may also have other shapes.

It should be noted that in the present embodiment, the second dielectric layer 26 is deposited on the top of the substrate 21, namely, the top surface of the first support layer 221. Before the support layer is etched, part of the second dielectric layer 26 on the top of the first support layer 221 needs to be removed by etching, and then, the first support layer 221 is etched to form the opening 261.

In the present embodiment, the first support layer 221 is etched to expose part of the first sacrificial layer 231, and the first sacrificial layer 231 is removed by acid pickling to expose the second support layer 222; and then, the second support layer 222 is etched to expose part of the second sacrificial layer 232, and the second sacrificial layer 232 is removed by acid pickling. Here, the shape of the opening 261 may be defined by a multiple patterned photoetching process, and the second dielectric layer 26 and the first support layer 221 may be etched by the dry etching process.

Figure 12:
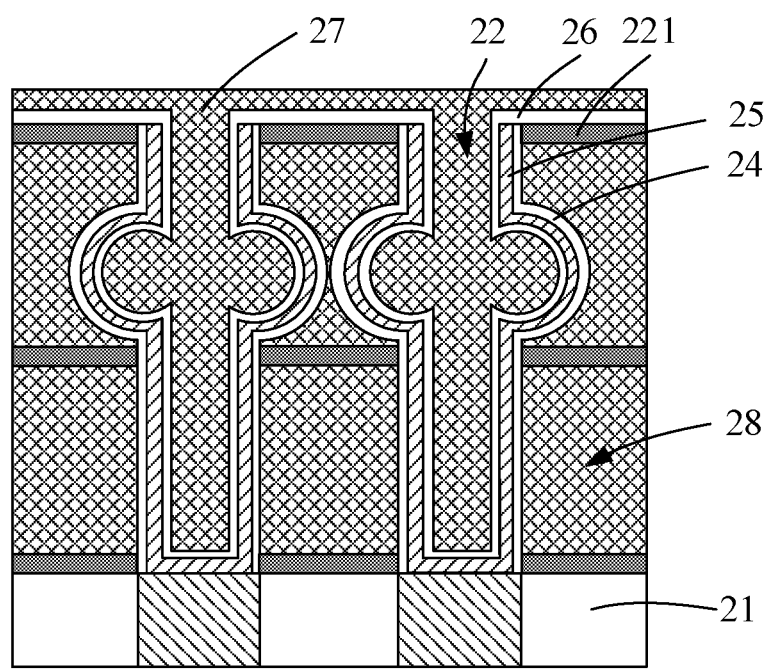
FIG. 12 is a fourth schematic structure diagram corresponding to a step of a preparation method of a semiconductor structure according to the other embodiment of the present disclosure.

Referring to FIG. 12, a second electrode 27 is formed on the surface of the second dielectric layer 26.

In the present embodiment, the sacrificial layer is removed by etching to form the space area 28 for exposing the outer surface of the first dielectric layer 24, and the space area 28 and the groove 22 are filled with the second electrode 27, such that the second electrode 27 surrounds the inner and outer sides of the first electrode 25. Thus, it is beneficial to increase a capacitance value of the capacitor.

Another embodiment of the present disclosure also provides a preparation method of a semiconductor structure. The technical solution provided by the present embodiment is substantially the same as the previous embodiment, and has a main difference as follows: the support layer is etched to form an opening for at least exposing part of the sacrificial layer to expose the first electrode on which a third dielectric layer is deposited.

Figure 13:
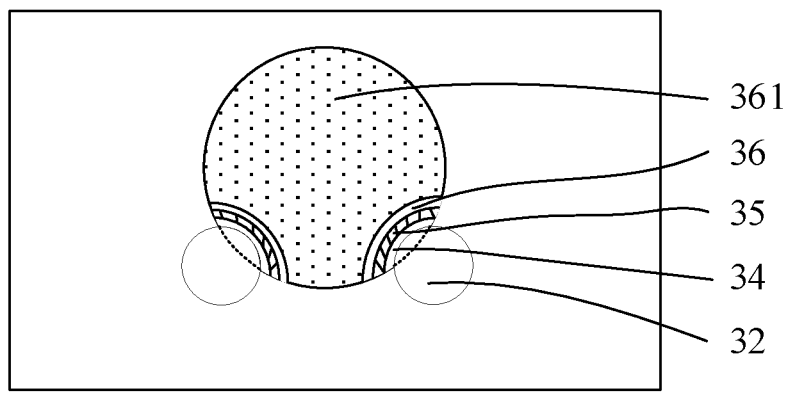
FIG. 13 is a first schematic structure diagram corresponding to a step of a preparation method of a semiconductor structure according to yet another embodiment of the present disclosure.
Figure 14:
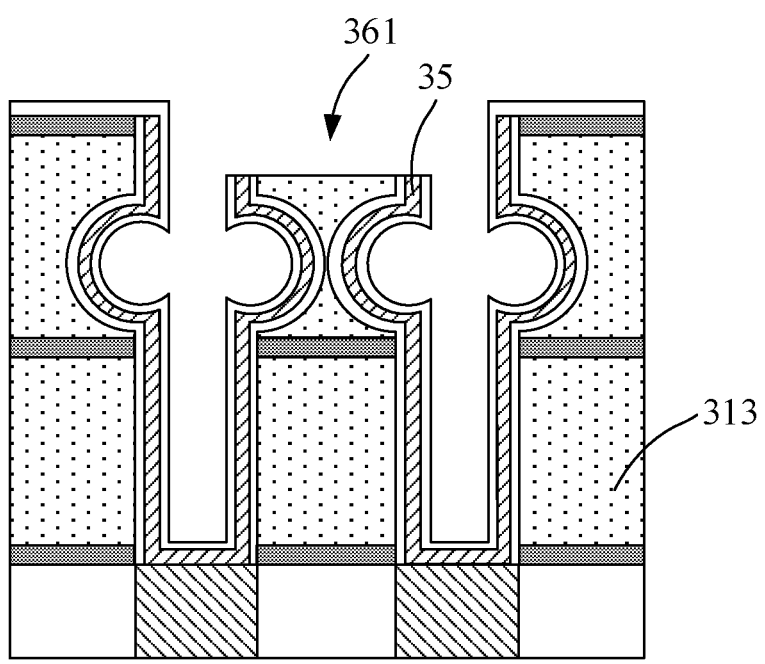
FIG. 14 is a second schematic structure diagram corresponding to a step of a preparation method of a semiconductor structure according to the other embodiment of the present disclosure.

FIG. 13 is a structural top view of the semiconductor structure corresponding to the present embodiment, and FIG. 14 is a schematic view of a corresponding cross-sectional structure.

In some embodiments, as shown in FIGS. 13 and 14, the opening 361 and the groove 32 share a common part. During the process of etching the intermediate dielectric layer 313 to form the opening 361, the part of the second dielectric layer 36 located on the top of the first electrode 35 is removed by etching to expose the top surface of the first electrode 35.

Figure 15:
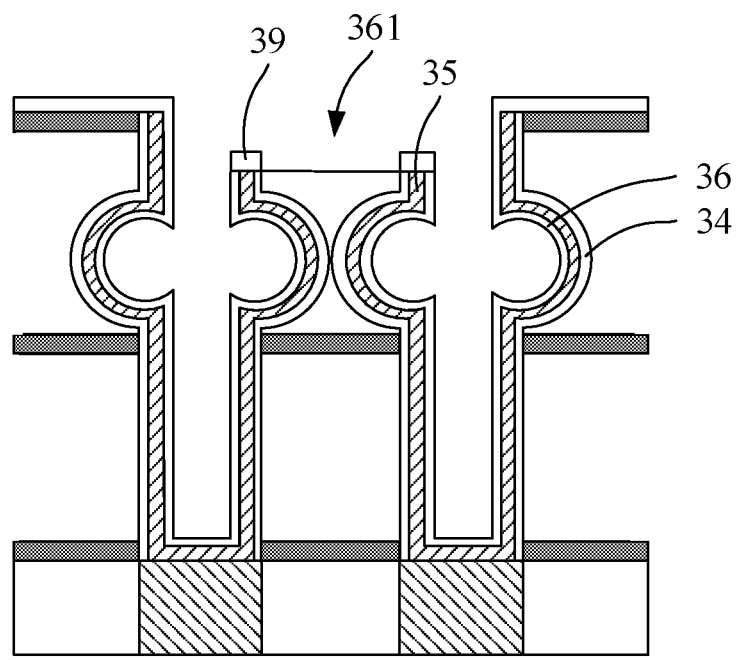
FIG. 15 is a third schematic structure diagram corresponding to a step of a preparation method of a semiconductor structure according to the other embodiment of the present disclosure.
Figure 16:
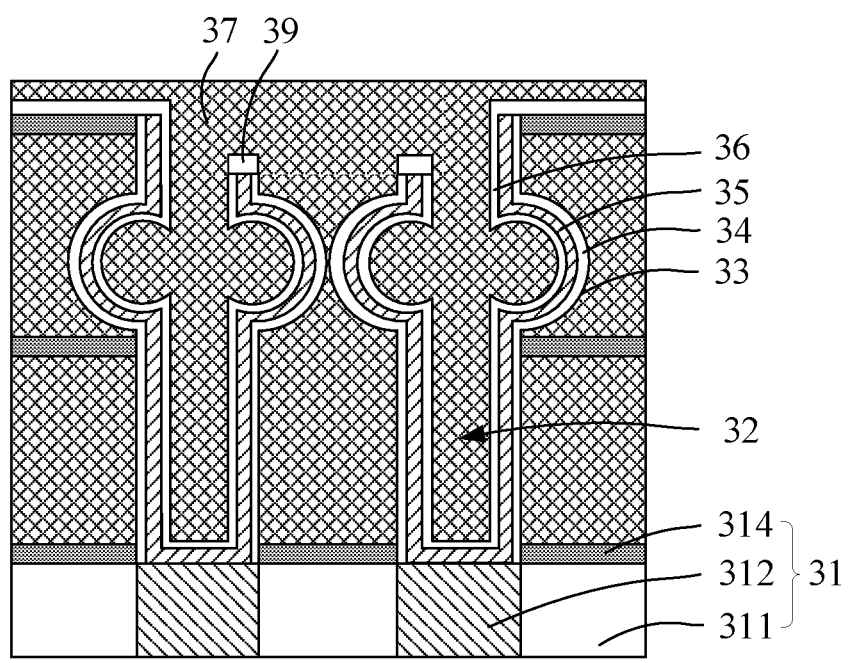
FIG. 16 is a fourth schematic structure diagram corresponding to a step of a preparation method of a semiconductor structure according to the other embodiment of the present disclosure.

As shown in FIGS. 15 and 16, before the second electrode 37 is deposited, a third dielectric layer 39 is deposited on the top of the exposed first electrode 35. In this way, the contact between the first electrode 35 and the second electrode 37 can be avoided in case that the second electrode 37 is subsequently deposited, thereby ensuring the effectiveness of the capacitor.

Here, the material of the third dielectric layer 39 contains a high-K material, such as any one or any combination of Zr, Hf, Nb, Al and O. In this way, it is beneficial to further improve the isolation effect of the third dielectric layer 39.

In the present embodiment, part of the top surface of the first electrode 35 is exposed through the opening 361. Thus, the exposed top surface of the first electrode 35 is covered before the second electrode 37 is deposited to prevent the first electrode 35 from being in contact with the second electrode 37, thereby ensuring the effectiveness of the capacitor.

Correspondingly, a semiconductor structure is further provided according to an embodiment of the present disclosure, and may be manufactured by any one of the above methods. FIG. 16 is a schematic cross-sectional structure diagram of a semiconductor structure according to an embodiment of the present disclosure.

Referring to FIG. 16, in the present embodiment, the semiconductor structure includes: a substrate 31 having a groove 32, a first dielectric layer 34 located on a side wall of the groove 32, a first electrode 35 located on the bottom of the groove 32 and on an inner surface of the first dielectric layer 34, a second dielectric layer 36 located on a surface of the first electrode 35, and a second electrode 37 located on a surface of the second dielectric layer 36.

In some embodiments, the substrate 31 includes a substrate 311 and an intermediate dielectric layer (not shown in the figure); a conductive structure 312 is arranged in the substrate 311; and the groove 32 runs through the intermediate dielectric layer so that the conductive structure 312 is exposed. The substrate 31 is used to carry formed storage capacitors; and the intermediate dielectric layer is used to isolate respective capacitors.

In the present embodiment, the intermediate dielectric layer specifically includes a plurality of support layers 314 connected to the first dielectric layer 34; the groove 32 runs through the support layers 314 so that side surfaces of the support layers are formed, and the first dielectric layer 34 is in direct contact with the side surfaces of the support layers 314. The support layer 314 arranged in the intermediate dielectric layer can ensure the stability of the intermediate dielectric layer. The support layer 314 may be located at any position or multiple positions of the top, bottom and middle of the intermediate dielectric layer, and the position and the number of the support layer 314 are unlimited.

In the present embodiment, the side wall of the groove 32 has a recess region 33; and the first dielectric layer 34 covers the recess region 33.

In the present embodiment, the first dielectric layer 34 in the recess region 33 on the side wall of the groove 32 is in direct contact with the first dielectric layer 34 in the recess region 33 on the side wall of the adjacent groove 32. In other embodiments, there is a gap between the first dielectric layer in the recess region on the side wall of the groove and the first dielectric layer in the recess region on the side wall of the adjacent groove.

In one of the embodiments, in the present embodiment, the material of the first dielectric layer 34 contains a high-K material including any one or any combination of Zr, Hf, Nb, Al and O. In this way, it is beneficial to improve the isolation effect between adjacent grooves 32.

In the present embodiment, the second electrode 37 is also located on the outer surface of the first dielectric layer 34. In some embodiments, the first electrode 35 is located on the inner surface of the first dielectric layer 34, and the second electrode 37 is located on the outer surface of the first dielectric layer 34. In this way, the second electrode 37 can be distributed around the two sides of the first electrode 35, thereby increasing the capacitance value of the capacitor.

In the present embodiment, the semiconductor structure further includes a third dielectric layer 39. The third dielectric layer 39 is located between the top of the first electrode 35 and the second electrode 37, and is in direct contact with the first electrode 35 and the second electrode 37. Herein, the material of the third dielectric layer 39 contains a high-K material.

In the present embodiment, adjacent first electrodes 35 are isolated from each other by the first dielectric layer 34, and the second electrode 37 surrounds the inside and outside of the entire first electrode 35. Thus, the capacitance failure caused by the connection between adjacent first electrodes 35 and the connection between the first electrode 35 and the second electrode 37 can be avoided, and in one of the embodiments, the capacitance value of the capacitor is increased.

A person of ordinary skill in the art can understand that the above embodiments are specific embodiments for realizing the present disclosure, and in actual applications, various changes can be made in form and details without departing from the spirit and scope of the present disclosure. Any person skilled in the art can change and modify all of the above embodiments without departing from the spirit and scope of the present disclosure. Therefore, the protection scope of the present disclosure shall be subject to the scope defined by the claims.

What is claimed is:

1. A method of a semiconductor structure, comprising:
   providing a substrate;
   forming a groove on the substrate;
   forming a first dielectric layer on a side wall of the groove;
   forming a first electrode on the bottom of the groove and on an inner surface of the first dielectric layer;
   forming a second dielectric layer on a surface of the first electrode; and
   forming a second electrode on a surface of the second dielectric layer,
   wherein the substrate comprises a support layer and a sacrificial layer, and
   wherein after forming the second dielectric layer on the surface of the first electrode and before forming the second electrode on the surface of the second dielectric layer, the method further comprises:
      forming an opening for at least exposing part of the sacrificial layer by etching the support layer, forming a space region for exposing an outer surface of the first dielectric layer by etching and removing the sacrificial layer through the opening, and
   forming the second electrode in the space region.

2. The method according to claim 1, wherein the side wall of the groove has a recess region, and the first dielectric layer covers the recess region.

3. The method according to claim 2, wherein the first dielectric layer formed in the recess region on the side wall of the groove is in direct contact with the first dielectric layer on a side wall of a groove adjacent to the groove.

4. The method according to claim 1, wherein a material of the first dielectric layer contains a high-K material.

5. The method according to claim 4, wherein the high-K material contains any one or any combination of Zr, Hf, Nb, Al and O.

6. The method according to claim 1, wherein forming the opening for at least exposing the part of the sacrificial layer by etching the support layer further comprises: exposing the first electrode through the opening; and
   after forming the space region for exposing the outer surface of the first dielectric layer by etching and removing the sacrificial layer through the opening and before forming the second electrode on the surface of the second dielectric layer, the method further comprises: depositing a third dielectric layer on the exposed first electrode.

7. A semiconductor structure, comprising:
   a substrate having a groove;
   a first dielectric layer located on a side wall of the groove;
   a first electrode located on the bottom of the groove and on an inner surface of the first dielectric layer;
   a second dielectric layer located on a surface of the first electrode;
   a second electrode located on a surface of the second dielectric layer; and
   a third dielectric layer,
   wherein the third dielectric layer is located between the top of the first electrode and the second electrode, and is in direct contact with the first electrode and the second electrode.

8. The semiconductor structure according to claim 7, wherein the substrate comprises a support layer, the groove running through the support layer so that a side surface of the support layer is formed, and the first dielectric layer being in direct contact with the side surface of the support layer.

9. The semiconductor structure according to claim 7, wherein the second electrode is also located on an outer surface of the first dielectric layer.

10. The semiconductor structure according to claim 7, wherein a material of the first dielectric layer contains a high-K material.

11. The semiconductor structure according to claim 10, wherein the high-K material contains any one or any combination of Zr, Hf, Nb, Al and O.

12. The semiconductor structure according to claim 7, wherein a material of the third dielectric layer contains a high-K material.

13. The semiconductor structure according to claim 7, wherein the side wall of the groove has a recess region, and the first dielectric layer covers the recess region.

14. The semiconductor structure according to claim 13, wherein the first dielectric layer in the recess region on the side wall of the groove is in direct contact with the first dielectric layer on a side wall of a groove adjacent to the groove.

* * * * *